(12) United States Patent
Sakurasawa (10) Patent No.: US 10,594,021 B2
(45) Date of Patent: Mar. 17, 2020

(54) MODULE AND TIMEPIECE (71) Applicant: CASIO COMPUTER CO., LTD., Tokyo (JP)

(72) Inventor: Tadashi Sakurasawa, Higashikurume (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 264 days.

(21) Appl. No.: 15/634,218

(22) Filed: Jun. 27, 2017

(65) Prior Publication Data
US 2018/0013189 A1 Jan. 11, 2018

(30) Foreign Application Priority Data
Jul. 7, 2016 (JP) .................. 2016-135149

(51) Int. Cl.
*H01Q 1/22* (2006.01)
*H01Q 1/24* (2006.01)
(Continued)

(52) U.S. Cl.
CPC ............ *H01Q 1/24* (2013.01); *G04B 47/066* (2013.01); *G04G 21/02* (2013.01); *G04R 60/10* (2013.01); *G04R 60/12* (2013.01); *H01Q 1/002* (2013.01); *H01Q 1/273* (2013.01); *H01Q 7/08* (2013.01); *H05K 1/18* (2013.01); *G04B 37/0008* (2013.01);
(Continued)

(58) Field of Classification Search
CPC ............ H01Q 1/24; H01Q 7/08; H01Q 1/002; H01Q 1/273; G04B 47/066; G04B 37/0008; G04R 60/10; H05K 1/18; H05K 1/181; H05K 2201/10098
See application file for complete search history.

(56) References Cited

U.S. PATENT DOCUMENTS 5,331,608 A * 7/1994 Umemoto .............. G04G 21/04
368/10
5,696,518 A * 12/1997 Itoh ........................ G04G 21/04
343/718
(Continued)

FOREIGN PATENT DOCUMENTS

JP 2000-056045 A 2/2000
JP 2008-020326 A 1/2008
(Continued)

OTHER PUBLICATIONS

Notification of Reasons for Refusal dated May 7, 2018 received in Japanese Patent Application No. JP 2016-135149 together with an English language translation.
(Continued)

*Primary Examiner* — Daniel Munoz
*Assistant Examiner* — Bamidele A Jegede
(74) *Attorney, Agent, or Firm* — Scully Scott Murphy & Presser (57) ABSTRACT

A module including a circuit board, a conductive displacement section which is arranged along an outer periphery of the circuit board and displaced in response to a switching operation, and an antenna which is arranged on the circuit board along the outer periphery of the circuit board with one end oriented toward a direction of 3 o'clock or 9 o'clock and the other end oriented toward a direction of 6 o'clock or 12 o'clock.

12 Claims, 5 Drawing Sheets (51) Int. Cl.
*G04R 60/12* (2013.01)
*G04G 21/02* (2010.01)
*G04B 47/06* (2006.01)
*G04R 60/10* (2013.01)
*H01Q 1/00* (2006.01)
*H01Q 1/27* (2006.01)
*H01Q 7/08* (2006.01)
*H05K 1/18* (2006.01)
*G04B 37/00* (2006.01)

(52) U.S. Cl.
CPC ... *H05K 1/181* (2013.01); *H05K 2201/10098* (2013.01)

(56) References Cited

U.S. PATENT DOCUMENTS

| | | | | |
|---|---|---|---|---|
| 6,356,512 | B1* | 3/2002 | Martin | G04G 21/04 343/718 |
| 6,825,751 | B1* | 11/2004 | Kita | G06K 19/07762 340/10.52 |
| 6,854,978 | B2* | 2/2005 | Noirjean | H01Q 1/273 343/718 |
| 7,966,154 | B2* | 6/2011 | Vock | A42B 3/046 702/188 |
| 8,295,128 | B2 | 10/2012 | Hasumi et al. | |
| 9,459,593 | B2 | 10/2016 | Miwa et al. | |
| 2004/0233789 | A1* | 11/2004 | Oguchi | G04C 3/008 368/47 |
| 2005/0122270 | A1* | 6/2005 | Yano | G04G 21/04 343/718 |
| 2005/0195689 | A1* | 9/2005 | Oguchi | G04C 10/02 368/47 |
| 2006/0066498 | A1* | 3/2006 | Abe | H01Q 1/273 343/788 |
| 2006/0227058 | A1* | 10/2006 | Zellweger | H01Q 1/273 343/718 |
| 2007/0041275 | A1* | 2/2007 | Barras | G04G 21/04 368/14 |
| 2007/0097795 | A1* | 5/2007 | Hosobuchi | G04B 19/247 368/37 |
| 2010/0074059 | A1* | 3/2010 | Hasumi | G04C 3/008 368/47 |
| 2010/0188307 | A1* | 7/2010 | Murata | H01Q 1/273 343/788 |
| 2012/0170423 | A1* | 7/2012 | Fujisawa | G04C 10/02 368/10 |
| 2013/0051193 | A1* | 2/2013 | Sato | G04C 10/02 368/205 |
| 2013/0051199 | A1* | 2/2013 | Sakurasawa | H02K 5/24 368/276 |
| 2014/0233357 | A1 | 8/2014 | Miwa et al. | |

FOREIGN PATENT DOCUMENTS

| | | |
|---|---|---|
| JP | 2013-175846 A | 9/2013 |
| JP | 2014-157043 A | 8/2014 |
| JP | 2015-121544 A | 7/2015 |
| WO | 2008/102752 A1 | 8/2008 |

OTHER PUBLICATIONS

First Office Action dated Apr. 22, 2019 in Chinese Patent Application No. 201710521926.9.

* cited by examiner

MODULE AND TIMEPIECE

CROSS-REFERENCE TO RELATED APPLICATION

This application is based upon and claims the benefit of priority from the prior Japanese Patent Application No. 2016-135149, filed Jul. 7, 2016, the entire contents of which are incorporated herein by reference.

BACKGROUND OF THE INVENTION

1. Field of the Invention

The present invention relates to a module which is used for electronic devices such as wristwatches, mobile phones, and portable digital assistants, and a timepiece having the same.

2. Description of the Related Art

For example, a wristwatch is known which has a structure where an upper opening of a wristwatch case has been closed by a timepiece glass, a lower opening of the wristwatch case has been closed by a rear cover made of metal, and a timepiece module on which a bar antenna is mounted has been incorporated into this wristwatch case, as described in Japanese Patent Application Laid-Open (Kokai) Publication No. 2013-175846.

In this wristwatch, the wristwatch case is constituted by an outer case made of metal and an inner case made of synthetic resin arranged inside the outer case. This inner case made of synthetic resin sufficiently separates the bar antenna mounted on the timepiece module from the outer case made of metal by electrically insulating the outer case and the rear cover, and thereby improves the receiving sensitivity of the bar antenna.

However, in this type of wristwatch, in a case where a plurality of metal plate springs, which are bent and deformed in response to a switching operation on a switch section, are respectively arranged in a plurality of areas on an outer peripheral portion of the timepiece module, and one of the plurality of plate springs is arranged in a longitudinal direction of the bar antenna, the plate spring blocks a magnetic field generated in the bar antenna. Accordingly, the receiving sensitivity of the bar antenna is decreased.

SUMMARY OF THE INVENTION

An object of the present invention is to provide a module capable of preventing the receiving sensitivity of an antenna from decreasing by reducing radio disturbance by a conductive displacement section, and a timepiece having the same.

In accordance with one aspect of the present invention, there is provided a module comprising: a circuit board; a conductive displacement section which is arranged along an outer periphery of the circuit board and displaced in response to a switching operation; and an antenna which is arranged on the circuit board along the outer periphery of the circuit board with one end oriented toward a direction of 3 o'clock or 9 o'clock and the other end oriented toward a direction of 6 o'clock or 12 o'clock.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

An embodiment where the present invention has been applied in a wristwatch will hereinafter be described with reference to FIG. 1 to FIG. 5.

Figure 1:
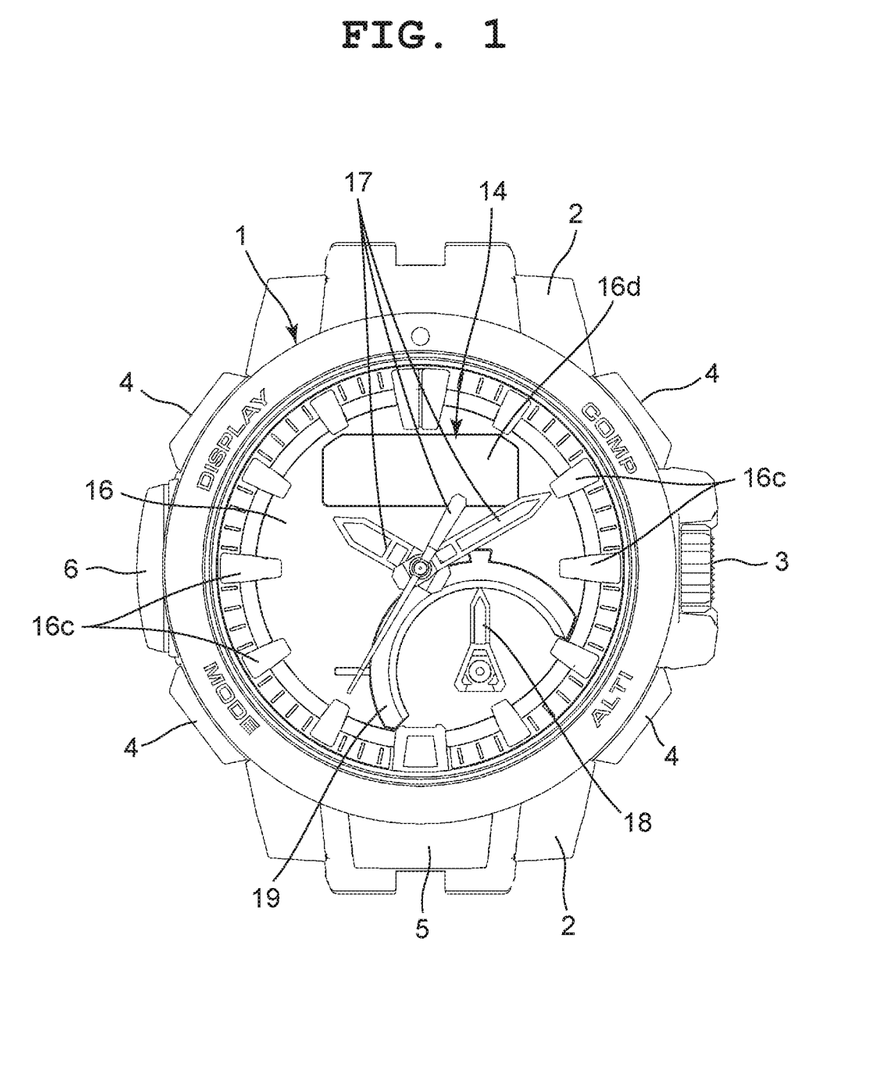
FIG. 1 is an enlarged front view showing an embodiment where the present invention has been applied in a wristwatch.

This wristwatch includes a wristwatch case 1, as shown in FIG. 1. On the 12 o'clock side and the 6 o'clock side of this wristwatch case 1, band attachment sections 2 for attaching a timepiece band (not shown) are respectively provided. On the 3 o'clock side of this wristwatch case 1, a switch device 3 such as a crown, which makes a switching movement for time correction and the like, is provided.

Figure 3:
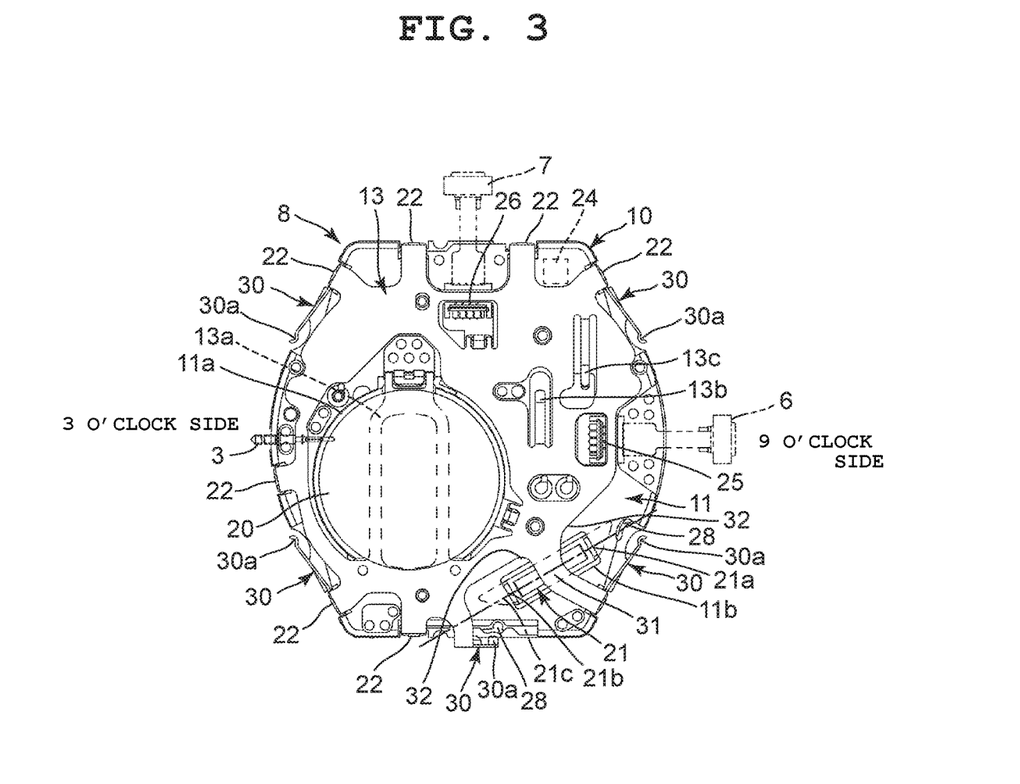
FIG. 3 is an enlarged rear view of the timepiece module shown in FIG. 2.

Also, on the 2 o'clock side, the 4 o'clock side, the 8 o'clock side, and the 10 o'clock side of this wristwatch case 1, push-button switches 4 are respectively provided, as shown in FIG. 1. On the 6 o'clock side of this wristwatch case 1, atop surface switch 5 is provided. Moreover, on the 9 o'clock side of this wristwatch case 1, an altimeter pressure sensor 6 is provided, as shown in FIG. 1 and FIG. 3. On the 12 o'clock side of this wristwatch case 1, a water depth pressure sensor 7 is provided, as shown in FIG. 3.

Figure 2:
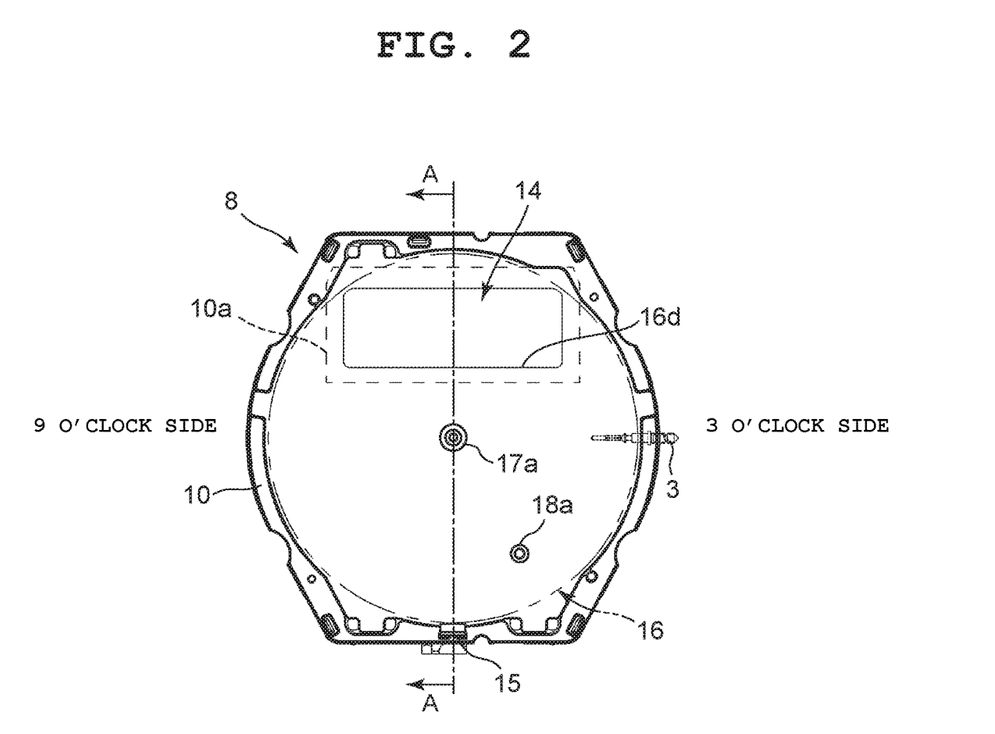
FIG. 2 is an enlarged plan view showing a timepiece module incorporated into the wristwatch shown in FIG. 1.
Figure 4:
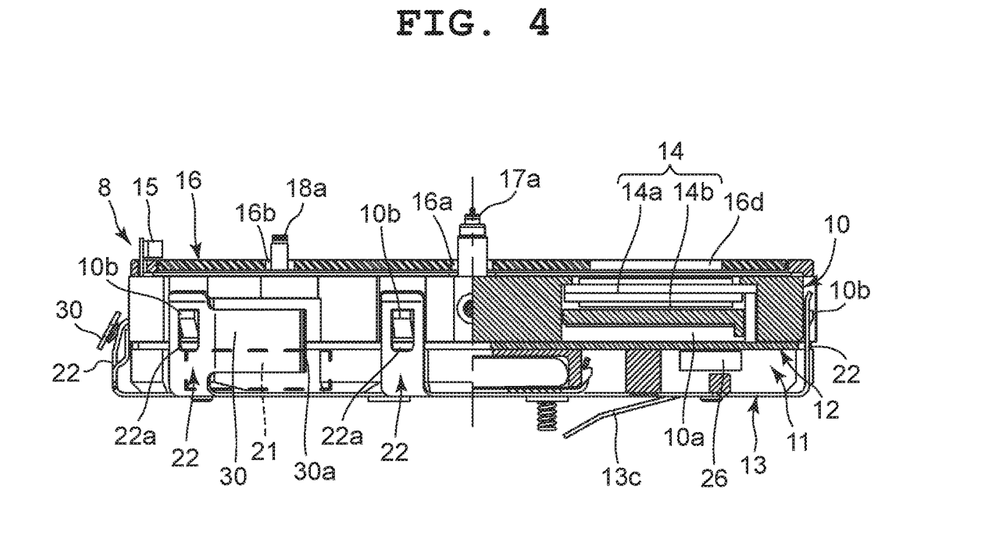
FIG. 4 is an enlarged side view of a portion of the timepiece module taken along line A-A in FIG. 2.

In this wristwatch case 1, a timepiece module 8 is provided, as shown in FIG. 2 to FIG. 4. This timepiece module 8 includes an upper housing 10, a lower housing 11, a circuit board 12, and a bottom plate 13 serving as a conductive plate. On the upper housing 10, a timepiece movement (not shown), a display device 14, and an illumination device 15 are mounted, and a dial 16 is arranged on the upper surface of this upper housing 10.

The timepiece movement has a time indication function and a sub-display function. In this embodiment, the display area for the time indication function is provided over substantially the entire area of the dial 16, as shown in FIG. 1. The sub-display function is a retrograde function representing an azimuth, and its display area is provided in a substantially fan shape ranging from the 3 o'clock side to the 6 o'clock side of the dial 16.

Also, this timepiece movement has a plurality of step motors and a gear train function (neither of them is shown), and is structured such that a hand shaft 17a and a sub-hand shaft 18a in the gear train function respectively protrude upward from the dial 16 via through holes 16a and 16b in the dial 16, as shown in FIG. 2 and FIG. 4.

In this embodiment, the time indication function of the timepiece movement is actualized by a structure where hands 17 such as a second hand, a minute hand, and an hour hand are attached to an upper end portion of the hand shaft 17a protruding upward via the through hole 16a provided in a central portion of the dial 16 and move above the dial 16, as shown in FIG. 2 and FIG. 4. As a result, in the time indication function, the hands 17 indicate an hour mark 16*c* provided on the outer periphery of the dial 16 so as to indicate the time, within substantially the entire area of the dial 16, as shown in FIG. 1.

Also, the retrograde function of this timepiece movement is actualized by a structure where a small hand 18 serving as a sub-hand is attached to an upper end portion of a sub-hand shaft 18*a* protruding upward via the through hole 16*b* provided on the about 5 o'clock side of the dial 16, and swings in a horizontal direction with the 12 o'clock direction as a center, in an area above the sub-display section 19 on the dial 16, as shown in FIG. 2 and FIG. 4. As a result, in the retrograde function, the small hand 18 indicates an azimuth within a substantially fan-shaped area ranging from the 3 o'clock side to the 6 o'clock side of the dial 16, as shown in FIG. 1.

Also, the display device 14 in the upper housing 10 has a horizontally elongated shape and arranged on the 12 o'clock side of the dial 16, as shown in FIG. 1 and FIG. 2. This display device 14 includes a display panel 14*a* and a backlight 14*b*, which are arranged within a display housing section 10*a* in the upper housing 10, as shown in FIG. 4. Also, this display device 14 is structured such that information displayed on the display panel 14*a* can be viewed from above the wristwatch case 1 via a horizontally elongated display window section 16*d* provided on the 12 o'clock side of the dial 16, as shown in FIG. 1.

In this embodiment, the display panel 14*a* is a liquid crystal display panel, and is structured to electrooptically display information such as time, day, and date, as shown in FIG. 1, FIG. 2, and FIG. 4. The backlight 14*b* is structured such that information displayed on the display panel 14*a* can be clearly viewed by the display panel 14*a* being illuminated from the rear surface side. Also, the illumination device 15 is a light emitting element such as a light emitting diode (LED), is arranged on the 6 o'clock side of the upper housing 10, and illuminates the upper surface side of the dial 16, as shown in FIG. 2 and FIG. 4.

Also, the lower housing 11 is provided with a battery housing section 11*a* that houses a button-type battery 20 and an antenna housing section 11*b* that houses an antenna 21, as shown in FIG. 3 and FIG. 4. In this embodiment, the battery housing section 11*a* is provided having a circular shape on substantially the 5 o'clock side of the lower housing 11, and the antenna housing section 11*b* is provided having a rectangular shape on the 7 o'clock side of the lower housing 11.

Also, the metal bottom plate 13 serving as a conductive plate is arranged on the lower surface of the lower housing 11, as shown in FIG. 3 and FIG. 4. This bottom plate 13 is provided with an electrode plate 13*a* which presses the battery 20 arranged within the battery housing section 11*a* in the lower housing 11. Also, this bottom plate 13 is provided with a board connection section 13*b* which comes in contact with an electrode terminal (not shown) of the circuit board 12 and a cover connection section 13*c* which comes in contact with a rear cover (not shown) attached to the bottom of the wristwatch case 1.

Also, on an outer peripheral portion of this bottom plate 13, a plurality of hook sections 22 are provided projecting upward, as shown in FIG. 3 and FIG. 4. These hook sections 22 are structured such that, when the circuit board 12 is arranged on the lower housing 11 with the bottom plate 13 being arranged on the lower surface of the lower housing 11 and the upper housing 10 is arranged on this circuit board 12, the hook sections 22 extend upward along the outer peripheral surfaces of the circuit board 12 and the upper housing 10, and locking holes 22*a* at their extending upper ends respectively engage with a plurality of projection sections 10*b* provided on the outer peripheral surface of the upper housing 10.

As a result, the bottom plate 13 is structured such that, when the lower housing 11, the circuit board 12, and the upper housing 10 are overlapped with one another, the locking holes 22*a* in the plurality of hook sections 22 respectively engage with the plurality of projection sections 10*b* provided on the outer peripheral surface of the upper housing 10, whereby the lower housing 11, the circuit board 12, and the upper housing 10 are integrally assembled, as shown in FIG. 3 and FIG. 4

Figure 5:
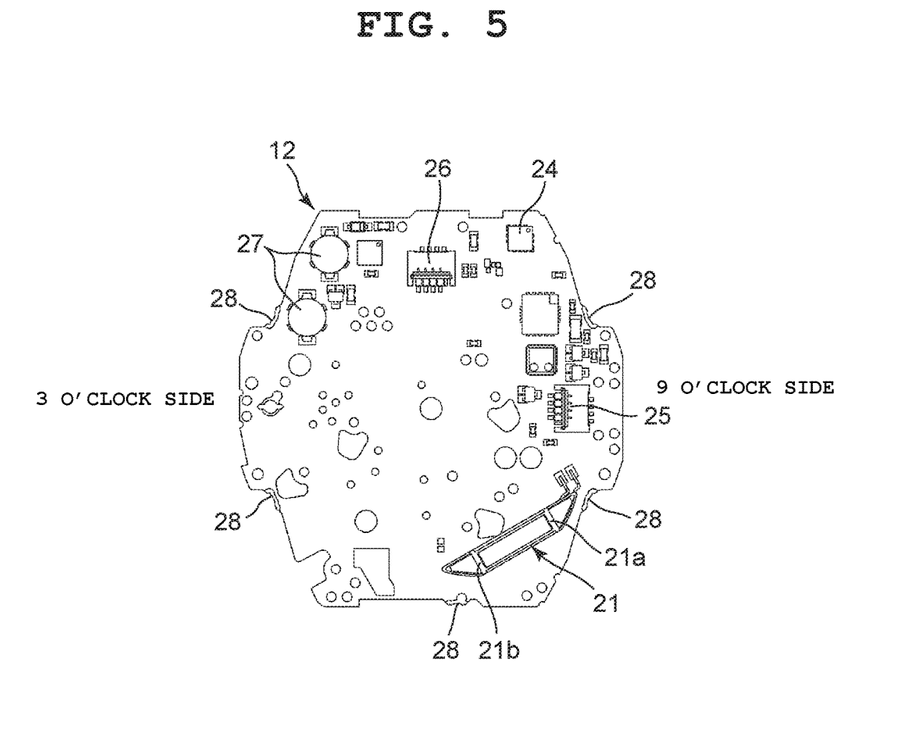
FIG. 5 is an enlarged rear view of a circuit board shown in FIG. 4.

The circuit board 12 is structured to be arranged between the upper housing 10 and the lower housing 11, as shown in FIG. 3 to FIG. 5. Here, in addition to an antenna 21, a magnetic sensor 24, a first connector 25, and a second connector 26, various types of electronic components such as a capacitor 27 are provided on the lower surface (front surface in FIG. 5) of this circuit board 12.

The antenna 21, which is a bar antenna, includes a bar-shaped core and a coil wound around this core (neither of them is shown), and is structured such that a magnetic field is generated from its one end 21*a* side toward the other end 21*b* side in a longitudinal direction of the core. This antenna 21 is arranged in an area on the 7 o'clock side on the lower surface (the front surface in FIG. 5) of the circuit board 12 with it being inclined from the 8 o'clock side toward the 6 o'clock side.

In this embodiment, the antenna 21 is arranged on the lower surface (the front surface in FIG. 5) of the circuit board 12 such that it is apart from the battery 20 housed in the battery housing section 11*a* in the lower housing 11 as much as possible and located along a direction substantially parallel to a direction of a tangent to the battery 20 housed in the battery housing section 11*a* in the lower housing 11, as shown in FIG. 3 and FIG. 5.

The magnetic sensor 24, which is used to detect an azimuth for the retrograde function, is arranged at the position where it is farthest from the antenna 21, or in other words, arranged on the 11 o'clock side on the lower surface (the front surface in FIG. 5) of the circuit board 12, as shown in FIG. 5. The first connector 25 to which the altimeter pressure sensor 6 is connected is arranged on the 9 o'clock side on the lower surface of the circuit board 12, and the second connector 26 to which the water depth pressure sensor 7 is connected is arranged on the 12 o'clock side on the lower surface of the circuit board 12.

Also, on outer peripheral portions of the circuit board 12, a plurality of contact terminals 28 are provided respectively corresponding to the plurality of press button switches 4 and the top surface switch 5, as shown in FIG. 5. That is, the plurality of contact terminals 28 are respectively provided on the outer peripheral portions of the circuit board 12 on the 2 o'clock side, the 4 o'clock side, the 6 o'clock side, the 8 o'clock side, and the 10 o'clock side.

In this embodiment, on outer peripheral portions of the bottom plate 13, a plurality of metal plate springs 30 serving as a plurality of displacement sections are provided, which separably come in contact with the plurality of contact terminals 28 provided on the outer peripheral portions of the circuit board 12, as shown in FIG. 3. These plate springs 30 are provided respectively corresponding to the plurality of press button switches 4 and top surface switches 30, as with the plurality of contact terminals 28.

That is, these plate springs 30 are structured such that they project toward the outer peripheral surface of the circuit board 12 from the outer peripheral portions of the bottom plate 13 and extend along the outer peripheral surface of the circuit board 12, and the extending leading ends 30a separably come in contact with the plurality of contact terminals 28, as shown in FIG. 3.

As a result, these plate springs 30 are structured such that they are bent and deformed in response to switching operations on the plurality of press button switches 4 and the upper switch 5, and make switching movements by the leading ends 30a of the bent and deformed plate springs 30 coming in contact with the plurality of contact terminals 28 provided on the outer peripheral surface of the circuit board 12, as shown in FIG. 3.

The antenna 21 is arranged such that its position in a vertical direction corresponds to the positions of the plurality of plate springs 30 around the outer periphery of the circuit board 12 in the vertical direction, as shown in FIG. 4. This antenna 21 is obliquely arranged on the 7 o'clock side of the circuit board 12 with its one end 21a being directed toward the 8 o'clock side of the circuit board 12 and the other end 21b being directed toward the 6 o'clock side of the circuit board 12, as shown in FIG. 3 and FIG. 5.

In this embodiment, the antenna 21 is obliquely arranged on the 7 o'clock side of the circuit board 12 along the plate spring 30 arranged corresponding to the push-button switch 4 on the 8 o'clock side and directed toward the 8 o'clock side from the 7 o'clock side, with the one end 21a of the antenna 21 being directed toward the leading end 30a side of the plate spring 30 on the 8 o'clock side, as shown in FIG. 3. Also, in this embodiment, no plate spring 30 is arranged on an extension of the central axis 21c of the antenna 21.

That is, in this antenna 21, a magnetic field is generated from its one end 21a side toward the other end 21b side. Accordingly, this antenna 21 is obliquely arranged on the 7 o'clock side of the circuit board 12 without a magnetic field generated in the antenna 21 being blocked by the plate spring 30 corresponding to the press button switch 4 on the 8 o'clock side.

In this embodiment, a connection section 31 connecting the plate spring 30 and the bottom plate 13 is provided between the plate spring 30 and the bottom plate 13 corresponding to the press button switch 4 on the 8 o'clock side, as shown in FIG. 3. This connection section 31 is formed having a narrow band plate shape, and is structured to cross a magnetic field generated in the antenna 21 at a substantially right angle and extend toward the outer periphery of the circuit board 12 while corresponding to a longitudinal central portion of the antenna 21 provided along the plate spring 30 corresponding to the press button switch 4 on the 8 o'clock side.

That is, this connection section 31 is structured such that it passes through an area corresponding to the longitudinal central portion of the antenna 21 from the outer periphery of the bottom plate 13 and extends toward the outer periphery of the circuit board 12 on the 7 o'clock side, and the plate spring 30 is provided at the extending end portion, as shown in FIG. 3. As a result, the connection section 31 is structured not to block a magnetic field generated in the antenna 21.

Also, clearance sections 32 for avoiding overlap with the antenna 21 are provided in portions of the bottom plate 13 on the sides of the connection section 31, as shown in FIG. 3. As a result, the bottom plate 13 is structured such that the portions in the vicinity of the antenna 21 are prevented from overlapping with the antenna 21 by the clearance sections 32 and therefore do not block a magnetic field generated in the antenna 21.

Also, the antenna 21 is arranged with the other end 21b in the longitudinal direction thereof corresponding to an area between the hook section 22 positioned on the 6 o'clock side and the plate spring 30 positioned on the 6 o'clock side and corresponding to the top surface switch 5, as shown in FIG. 3. In this embodiment, the hook section 22 positioned on the 6 o'clock side and the plate spring 30 corresponding to the top surface switch 5 on the 6 o'clock side are arranged to be apart from each other at predetermined intervals.

As a result, the antenna 21 is arranged with an extension of the central axis 21c being located between the hook section 22 on the 6 o'clock side and the plate spring 30 corresponding to the top surface switch 5 on the 6 o'clock side, as shown in FIG. 3. That is, the plate spring 30 and the hook section 22 are not arranged on an extension of the central axis 21c of the antenna 21. Accordingly, the antenna 21 is structured such that a magnetic field generated on the other end 21b side is not blocked by the hook section 22 on the 6 o'clock side and the plate spring 30 corresponding to the top surface switch 5 on the 6 o'clock side.

Next, the mechanism of the timepiece module 8 in this wristwatch is described.

In this timepiece module 8, the display area of the time indication function of the timepiece movement is arranged in substantially the entire area of the dial 16 on the upper surface of the upper housing 10, and the display area of the retrograde function of the timepiece movement is arranged in the fan-shaped area ranging from the 3 o'clock side to the 6 o'clock side of this dial 16.

Accordingly, in this timepiece module 8, the hands 17 for the time indication function move over substantially the entire upper area of the dial 16 to indicate the time, whereby the indication of the time can be easily viewed. Also, the small hand 18 for the retrograde function greatly swings in a horizontal direction with the 12 o'clock direction as a center, within the fan-shaped wide area ranging from the 3 o'clock side to the 6 o'clock side of the dial 16. Accordingly, the indication of an azimuth by the small hand 18 can be easily viewed.

In this embodiment, for the retrograde function, the sub-display section 19 is provided in the fan-shaped wide area ranging from the 3 o'clock side to the 6 o'clock side of the dial 16. As a result, the sub-display section 19 can be easily viewed, and the small hand 18 can be formed to be long. Accordingly, the viewability of the small hand 18 is improved and the user can intuitively visually recognize azimuth indication by the small hand 18. That is, azimuth indication by the small hand 18 becomes easier to view.

Also, in this timepiece module 8, the display device 14 is arranged on the 12 o'clock side in a manner not to block the display area of the sub-display section 19 for the retrograde function, so that the small hand 18 for the retrograde function does not overlap with the display area of the display device 14. As a result, the area where the display device 14 is mounted is widened and the display area of the display panel 14a is widened, whereby information displayed on the display panel 14a can be easily viewed.

Moreover, in this timepiece module 8, the altimeter pressure sensor 6 is provided on the 9 o'clock side, and the water depth pressure sensor 7 is provided on the 12 o'clock side. The altimeter pressure sensor 6 can detect an altitude and atmospheric pressure, and the water depth pressure sensor 7 can detect a water depth and water pressure, by which a wide range of outdoor activities can be performed.

Furthermore, in this timepiece module 8, the battery housing section 11a that houses the battery 20 has a circular shape ranging from the 2 o'clock side to the 6 o'clock side, and is provided on the 5 o'clock side in the lower housing 11. In addition, the antenna 21 is arranged on the 7 o'clock side on the lower surface of the circuit board 12. That is, the antenna 21 is arranged a sufficient distance away from the battery housing section 11a while being arranged far from the display device 14 so as not to be subjected to radio disturbance by the display device 14.

In this embodiment, the antenna 21 is obliquely arranged on the 7 o'clock side of the circuit board 12 with its one end 21a being directed toward the 8 o'clock side of the circuit board 12 and the other end 21b being directed toward the 6 o'clock side of the circuit board 12, as shown in FIG. 3. Accordingly, the antenna 21 can be mounted a sufficient distance away from the battery 20 housed in the battery housing section 11a in the lower housing 11.

In addition, by being arranged along the direction substantially parallel to the direction of the tangent to the battery 20 housed in the battery housing section 11a in the lower housing 11, the antenna 21 is mounted such that a magnetic field generated in the antenna 21 is not easily affected by the battery 20 and radio disturbance by the battery 20 does not occur.

Also, in this timepiece module 8, even though the plate springs 30 are arranged on the outer peripheral portions on the 8 o'clock side and the 6 o'clock side of the circuit board 12, radio disturbance in the antenna 21 due to these plate springs 30 is reduced by the antenna 21 being obliquely arranged on the 7 o'clock side of the circuit board 12.

That is, the antenna 21 is arranged such that its one end 21a is directed toward the leading end 30a of the plate spring 30 on the 8 o'clock and its longitudinal direction is oriented along the plate spring 30 corresponding to the push-button switch 4 on the 8 o'clock side. As a result, a magnetic field generated in the antenna 21 is not blocked by the plate spring 30 on the 8 o'clock side, whereby radio disturbance in the antenna 21 due to the plate spring 30 on the 8 o'clock side is reduced.

In this embodiment, the plate spring 30 on the 8 o'clock side is connected to the metal bottom plate 13 on the lower surface of the lower housing 11 by the connection section 31. However, this connection section 31 is arranged not to cause radio disturbance in the antenna 21. That is, this connection section 31 is formed having a narrow band plate shape, and arranged crossing a magnetic field generated in the antenna 21 while corresponding to the longitudinal central portion of the antenna 21 provided along the plate spring 30 on the 8 o'clock side. Accordingly, radio disturbance in the antenna 21 due to the connection section 31 is reduced.

Also, the metal bottom plate 13 is provided with the clearance sections 32 for avoiding overlap with the antenna 21. As a result, radio disturbance in the antenna 21 by the bottom plate 13 overlapping with the antenna 21 is reduced. Also, the antenna 21 is arranged on the circuit board 12 with an extension of the central axis 21c being located between the hook section 22 provided on the 6 o'clock side of the bottom plate 13 and the other plate spring 30 provided on the 6 o'clock side of the bottom plate 13. Accordingly, radio disturbance in the antenna 21 due to the hook section 22 and the other plate spring 30 is reduced.

As described above, the timepiece module 8 in the wristwatch includes the metal plate spring 30 which is arranged along the outer periphery of the circuit board 12 and is displaced in response to a switching operation, and the antenna 21 which is arranged along the plate spring 30 on the circuit board 12 with its one end 21a being directed toward the leading end 30a of the plate spring 30. Accordingly, radio disturbance due to the metal plate spring 30 can be reduced, whereby the receiving sensitivity of the antenna 21 can be prevented from decreasing.

That is, in this timepiece module 8, the antenna 21 is arranged along the plate spring 30. Therefore, a magnetic field to be generated in the antenna 21 can be generated along the metal plate spring 30. Accordingly, even though the one end 21a of the antenna 21 is arranged while being directed toward the leading end 30a of the plate spring 30, radio disturbance in the antenna 21 due to the plate spring 30 can be reduced, whereby the receiving sensitivity of the antenna 21 can be prevented from decreasing.

In this embodiment, the antenna 21 is a bar antenna having a bar-shaped core and a coil wound around this core, and is structured such that a magnetic field is generated from its one end 21a side toward the other end 21b side in a longitudinal direction of the core. Accordingly, by the antenna 21 being arranged along the plate spring 30, a magnetic field generated from the one end 21a side toward the other end 21b side of the antenna 21 can be prevented from being blocked by the metal plate spring 30.

Also, this timepiece module 8 includes the upper housing 10 and the lower housing 11 between which the circuit board 12 mounted with the antenna 21 is held, and the bottom plate 13 which is a conductive plate and by which the circuit board 12 is attached to the upper housing 10 and the lower housing 11 while being interposed therebetween, and the bottom plate 13 is provided with the plate springs 30. As a result, by the bottom plate 13 being arranged on the lower surface of the lower housing 11 with the circuit board 12 being arranged between the upper housing 10 and the lower housing 11, the plate springs 30 can be arranged around the outer periphery of the circuit board 12.

That is, the bottom plate 13 has the structure where the plurality of plate springs 30 and the plurality of hook sections 22 have been provided on its outer peripheral portions. Therefore, when the bottom plate 13 is arranged on the lower surface of the lower housing 11 with the lower housing 11, the circuit board 12, and the upper housing 10 being overlapped with one another, the lower housing 11, the circuit board 12, and the upper housing 10 can be integrally assembled with the plurality of plate springs 30 being arranged around the outer periphery of the circuit board 12, by the plurality of hook sections 22 engaging with the plurality of projection sections 10b on the outer peripheral surface of the upper housing 10.

In this embodiment, in the timepiece module 8, the connection section 31 connecting the bottom plate 13 serving as a conductive plate and the plate spring 30 is provided therebetween. This connection section 31 is formed into a narrow band plate shape and arranged crossing the magnetic field of the antenna 21 while corresponding to the longitudinal central portion of the antenna 21 along the plate spring 30. Therefore, even though the connection section 31 is arranged corresponding to the longitudinal central portion of the antenna 21, radio disturbance in the antenna 21 due to the connection section 31 can be reduced, whereby the receiving sensitivity of the antenna 21 can be prevented from decreasing.

Also, in this timepiece module 8, the metal bottom plate 13 serving as a conductive plate is provided with the clearance sections 32 for avoiding overlap with the antenna 21. Accordingly, radio disturbance by the bottom plate 13 overlapping with the antenna 21 can be reduced. By this structure as well, the receiving sensitivity of the antenna 21 can be prevented from decreasing.

Also, in this timepiece module 8, the antenna 8 is arranged in the circuit board 12 with an extension of its central axis 21c being located between the hook section 22 provided on the 6 o'clock side of the bottom plate 13 and the other plate spring 30 provided on the 6 o'clock side of the bottom plate 13. Accordingly, radio disturbance in the antenna 21 due to the hook section 22 and the other plate spring 30 can be reduced. By this structure as well, the receiving sensitivity of the antenna 21 can be prevented from decreasing.

In this embodiment, in the timepiece module 8, the antenna 21 is obliquely arranged on the 7 o'clock side of the circuit board 12 with its one end 21a being directed toward the 8 o'clock side of the circuit board 12 and the other end 21b being directed toward the 6 o'clock side of the circuit board 12. Therefore, even though the plurality of metal plate springs 30 are arranged on the plurality of portions on the outer periphery of the circuit board 12, radio disturbance due to these plate springs 30 can be almost completely prevented from occurring.

That is, in this timepiece module 8, even though the antenna 21 is arranged on the 7 o'clock side in the circuit board 12, radio disturbance in the antenna 21 due to the plurality of plate springs 30 provided on the bottom plate 13 and the bottom plate 13 can be reduced. Therefore, the antenna 21 can be favorably mounted on the 7 o'clock side in the circuit board 12.

Accordingly, in this timepiece module 8, by the antenna 21 being obliquely provided on the 7 o'clock side in the circuit board 12, various types of components such as the timepiece movement, the display device 14, the battery 20, the altimeter pressure sensor 6, the water depth pressure sensor 7, and the magnetic sensor 24 can be efficiently mounted in areas which avoids this antenna 21.

That is, in this timepiece module 8, even though the battery 20 is arranged on the 5 o'clock side that is an area close to the antenna 21, the antenna 21 can be arranged a sufficient distance away from the battery housing section 11a of the lower housing 11 housing the battery 20 and the antenna 21 can be arranged along the direction substantially parallel to the direction of the tangent to the battery 20 housed in the battery housing section 11a in the lower housing 11. Accordingly, radio disturbance in the antenna 21 due to the battery 20 can be reduced. By this structure as well, the receiving sensitivity of the antenna 21 can be prevented from decreasing.

Also, in this timepiece module 8, the altimeter pressure sensor 6, the water depth pressure sensor 7, and the magnetic sensor 24 can be efficiently mounted in a manner not to cause radio disturbance in the antenna 21, by being arranged on the 9 o'clock side, the 12 o'clock side, and the 11 o'clock side, respectively.

Also, in this timepiece module 8, the display device 14 can be mounted on the 12 o'clock side of the circuit board 12 which is farthest away from the antenna 21. Therefore, the mounting area of the display device 14 can be widened, so that the display area of the display panel 14a can be widened. As a result, information displayed on the display panel 14a can be easily viewed.

Accordingly, in this timepiece module 8, the display area of the time indication function of the timepiece movement can be arranged in substantially the entire area of the dial 16 arranged on the upper surface of the upper housing 10, and the display area of the retrograde function of the timepiece movement can be arranged in the fan-shaped area ranging from the 3 o'clock side to the 6 o'clock side of the dial 16 without overlapping with the display area of the display device 14.

As a result, in this timepiece module 8, the hands 17 for the time indication function can use substantially the entire area above the dial 16 so as to indicate the time, by which the indication of the time can be easily viewed. Also, for the retrograde function, the small hand 18 greatly swings in the horizontal direction with the 12 o'clock direction as a center, within the fan-shaped wide area ranging from the 3 o'clock side to the 6 o'clock side of the dial 16. Accordingly, azimuth indication by the small hand 18 can be easily viewed.

In this embodiment, for the retrograde function, the sub-display section 19 is provided in the fan-shaped wide area ranging from the 3 o'clock side to the 6 o'clock side of the dial 16 without overlapping with the display area of the display device 14. As a result, the sub-display section 19 can be easily viewed, and the small hand 18 can be formed to be long. Accordingly, the viewability of the small hand 18 can be improved and the user can intuitively visually recognize azimuth indication by the small hand 18. That is, azimuth indication by the small hand 18 can be more easily viewed.

In the above-described embodiment, the case has been described in which the retrograde function for indicating an azimuth is provided as a sub-display function of the timepiece movement. However, the present invention is not limited thereto. For example, a sub-display function for displaying information such as the ebb and flow of the tide and the waxing and waning of the moon may be provided.

Also, in the above-described embodiment, the antenna 21 is arranged along the plate spring 30. However, the antenna 21 is not necessarily required to be arranged along the plate spring 30, and may be arranged along the outer periphery of the circuit board 12. Moreover, in the above-described embodiment, the antenna 21 is arranged on the 7 o'clock side in the circuit board 12. However, the present invention is not limited thereto, and the antenna 21 may be arranged in any area as long as it is arranged along the outer periphery of the circuit board 12. For example, the antenna 21 may be arranged on the 5 o'clock side in the circuit board 12. That is, the one end 21a of the antenna 21 may be arranged to be directed toward the 3 o'clock side or the 9 o'clock side and the other end 21b thereof may be arranged to be directed toward the 6 o'clock side or the 12 o'clock side.

Furthermore, in the above-described embodiment, the present invention has been applied in a wristwatch. However, the present invention is not necessarily required to be applied in a wristwatch. For example, the present invention is applicable in various types of timepieces such as a travel watch, an alarm clock, a table clock, and a wall clock. Also, the present invention is not necessarily required to be applied in a timepiece. For example, the present invention is widely applicable to electronic devices such as a mobile phone and a personal digital assistant.

While the present invention has been described with reference to the preferred embodiments, it is intended that the invention be not limited by any of the details of the description therein but includes all the embodiments which fall within the scope of the appended claims.

What is claimed is:
1. A module comprising:
 a circuit board;
 a conductive displacement section which is arranged along an outer periphery of the circuit board and displaced in response to a switching operation;

an antenna which is arranged on the circuit board along the outer periphery of the circuit board with one end oriented toward a direction of 3 o'clock or 9 o'clock and the other end oriented toward a direction of 6 o'clock or 12 o'clock;

a housing in which the circuit board is arranged; and a conductive plate for attaching the circuit board to the housing, wherein the conductive plate is provided with the displacement section, wherein a connection section which connects the conductive plate and the displacement section is provided between the conductive plate and the displacement section, and wherein the connection section is arranged crossing a magnetic field of the antenna while corresponding to a longitudinal central portion of the antenna arranged along the displacement section.

2. The module according to claim 1, wherein the antenna comprises:

a core formed in a bar shape; and a coil wound around the core, wherein the magnetic field is generated from the one end toward the other end in a longitudinal direction of the core.

3. The module according to claim 2, wherein the conductive plate comprises a hook section for attaching the circuit board to the housing, and wherein the displacement section or the hook section is not arranged on an extension of a central axis of the antenna.

4. The module according to claim 1, wherein the conductive plate comprises a hook section for attaching the circuit board to the housing, and wherein the displacement section or the hook section is not arranged on an extension of a central axis of the antenna.

5. The module according to claim 4, wherein the conductive plate is provided with a clearance section for avoiding overlap with the antenna.

6. The module according to claim 4, wherein another displacement section which is arranged adjacent to the hook section is provided on the conductive plate while corresponding to the other end of the antenna in a longitudinal direction, and wherein the antenna is arranged on the circuit board with the extension of the central axis of the antenna being positioned between the hook section and the another displacement section.

7. The module according to claim 1, wherein the conductive plate is provided with a clearance section for avoiding overlap with the antenna.

8. The module according to claim 1, wherein a hook section for locking on the housing so as to attach the circuit board to the housing and another displacement section which is arranged adjacent to the hook section are provided on the conductive plate while corresponding to the other end of the antenna in a longitudinal direction, and wherein the antenna is arranged on the circuit board with an extension of a central axis of the antenna being positioned between the hook section and the another displacement section.

9. The module according to claim 1, wherein the antenna is obliquely arranged on 7 o'clock side of the circuit board with the one end being directed toward 8 o'clock side of the circuit board and the other end being directed toward the 6 o'clock side of the circuit board.

10. The module according to claim 1, wherein a battery, a pressure sensor, and a magnetic sensor are arranged in areas which avoid the antenna, on one surface side of the circuit board on which the antenna is arranged.

11. The module according to claim 1, wherein a movement comprised with a time indication function and a sub-display function, and a display device which electrooptically displays information are arranged on one surface side of the circuit board on which the antenna is not arranged, and wherein components actualizing the sub-display function and the display device are respectively arranged in areas which avoid the antenna.

12. A timepiece comprising the module according to claim 1.

* * * * *